(12) United States Patent
Ko et al.

(10) Patent No.: US 9,368,369 B2
(45) Date of Patent: Jun. 14, 2016

(54) METHODS FOR FORMING A SELF-ALIGNED CONTACT VIA SELECTIVE LATERAL ETCH

(71) Applicant: APPLIED MATERIALS, INC., Santa Clara, CA (US)

(72) Inventors: Jungmin Ko, San Jose, CA (US); Sean Kang, San Ramond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 43 days.

(21) Appl. No.: 14/535,055

(22) Filed: Nov. 6, 2014

(65) Prior Publication Data
US 2016/0133480 A1    May 12, 2016

(51) Int. Cl.
*H01L 21/768*    (2006.01)
*H01L 21/311*    (2006.01)

(52) U.S. Cl.
CPC .... *H01L 21/31116* (2013.01); *H01L 21/76804* (2013.01); *H01L 21/76805* (2013.01); *H01L 21/76816* (2013.01); *H01L 21/76826* (2013.01); *H01L 21/76897* (2013.01)

(58) Field of Classification Search
CPC .............. H01L 21/76804; H01L 21/76805; H01L 21/76816; H01L 21/76826; H01L 21/76897
See application file for complete search history.

(56) References Cited

U.S. PATENT DOCUMENTS

| 5,030,319 A * | 7/1991 | Nishino ............ H01L 21/76802 |
| | | 134/1 |
| 2011/0223755 A1 | 9/2011 | Kao et al. |
| 2013/0109175 A1 * | 5/2013 | Zhang ............... H01L 21/76897 |
| | | 438/675 |
| 2015/0111389 A1 | 4/2015 | He et al. |

FOREIGN PATENT DOCUMENTS

CN    101459071 A *    6/2009

OTHER PUBLICATIONS

Ogawa et al., Dry cleaning technology for removal of silicon native oxide employing hot NH3/NF3 exposure, Aug. 2002. Jpn. J. Appl. Phys., vol. 41, pp. 5349-5358.*
U.S. Appl. No. 14/535,055, filed Nov. 6, 2015, Ko et al.

* cited by examiner

*Primary Examiner* — Zandra Smith
*Assistant Examiner* — Molly Reida
(74) *Attorney, Agent, or Firm* — Moser Taboada; Alan Taboada

(57) ABSTRACT

In some embodiments methods of processing a substrate include: providing a substrate having a contact structure formed on the substrate, wherein the contact structure comprises a feature defined by gate structures, a silicon nitride layer disposed on a upper surface of the gate structures and on sidewalls and a bottom of the feature, and an oxide layer disposed over the silicon nitride layer and filling the feature; etching an opening through the oxide layer to the silicon nitride layer disposed on the bottom of the opening, wherein a width of the opening is less than a width of the feature; expanding the opening in the oxide layer to form a tapered profile; exposing the substrate to ammonia and nitrogen trifluoride to form an ammonium fluoride gas that forms an ammonium hexafluorosilicate film on the oxide layer; and heating the substrate to a second temperature to sublimate the ammonium hexafluorosilicate film.

20 Claims, 4 Drawing Sheets

METHODS FOR FORMING A SELF-ALIGNED CONTACT VIA SELECTIVE LATERAL ETCH

FIELD

Embodiments of the present disclosure generally relate to substrate processing techniques, and more particularly to selective etching processes used, for example, in microelectronic device fabrication.

BACKGROUND

Many semiconductor manufacturing processes, for example the formation of contacts, etch through one or more layers of oxide material disposed in the vicinity of a nitride material. For example, in the formation of a contact, a field oxide layer must be etched down to the nitride layer at the bottom of a feature to subsequently form a metal contact. However, during this etching process the nitride layer formed over the gate structures of the contact may also be etched and become significantly reduced in thickness, leading to electrical shortage and performance degradation in the completed device.

Accordingly, the inventors have provided improved methods of selective etching of materials on a substrate.

SUMMARY

Embodiments of methods for selective lateral etching of an oxide layer in forming a self-aligned contact are described herein. In some embodiments, a method of processing a substrate includes: (a) providing a substrate having a contact structure formed on the substrate, wherein the contact structure comprises a feature defined by gate structures, a silicon nitride layer disposed on a upper surface of the gate structures and on sidewalls and a bottom of the feature, and an oxide layer disposed over the silicon nitride layer, wherein the oxide layer fills the feature; (b) etching an opening in the oxide layer, wherein the opening is formed through the oxide layer to the silicon nitride layer disposed on the bottom of the opening and wherein a width of the opening is less than a width of the feature; (c) expanding the opening in the oxide layer to form a profile tapered toward a top surface of the substrate; (d) exposing the substrate to a first process gas comprising ammonia and nitrogen trifluoride to form an ammonium fluoride ($NH_4F$) gas, wherein the ammonium fluoride ($NH_4F$) gas reacts with the oxide layer to form an ammonium hexafluorosilicate (($NH_4)_2SiF_6$) film on the oxide layer; and (e) heating the substrate to a second temperature to sublimate the ammonium hexafluorosilicate (($NH_4)_2SiF_6$) film.

In some embodiments, a method of processing a substrate includes: (a) providing a substrate having a contact structure formed on the substrate, wherein the contact structure comprises a feature defined by gate structures, a silicon nitride layer disposed on a upper surface of the gate structures and on sidewalls and a bottom of the feature, and an oxide layer disposed over the silicon nitride layer, wherein the oxide layer fills the feature; (b) etching an opening in the oxide layer, wherein the opening is formed through the oxide layer to the silicon nitride layer disposed on the bottom of the opening and wherein a width of the opening is less than a width of the feature; (c) expanding the opening in the oxide layer to form a profile tapered toward a top surface of the substrate by applying a bias power to the substrate while exposing the substrate to a second process gas; (d) exposing the substrate to a first process gas comprising ammonia and nitrogen trifluoride to form an ammonium fluoride ($NH_4F$) gas, wherein the ammonium fluoride ($NH_4F$) gas reacts with the oxide layer to form an ammonium hexafluorosilicate (($NH_4)_2SiF_6$) film on the oxide layer; (e) heating the substrate to a second temperature to sublimate the ammonium hexafluorosilicate (($NH_4)_2SiF_6$) film; and (f) repeating (d)-(e) until the oxide layer is substantially etched from the sidewalls and bottom of the feature.

In some embodiments, a computer readable medium is provided having instructions stored thereon that, when executed, causes a process chamber to perform a method for processing a substrate. The method may include any of the methods disclosed herein.

Other and further embodiments of the present disclosure are described below.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
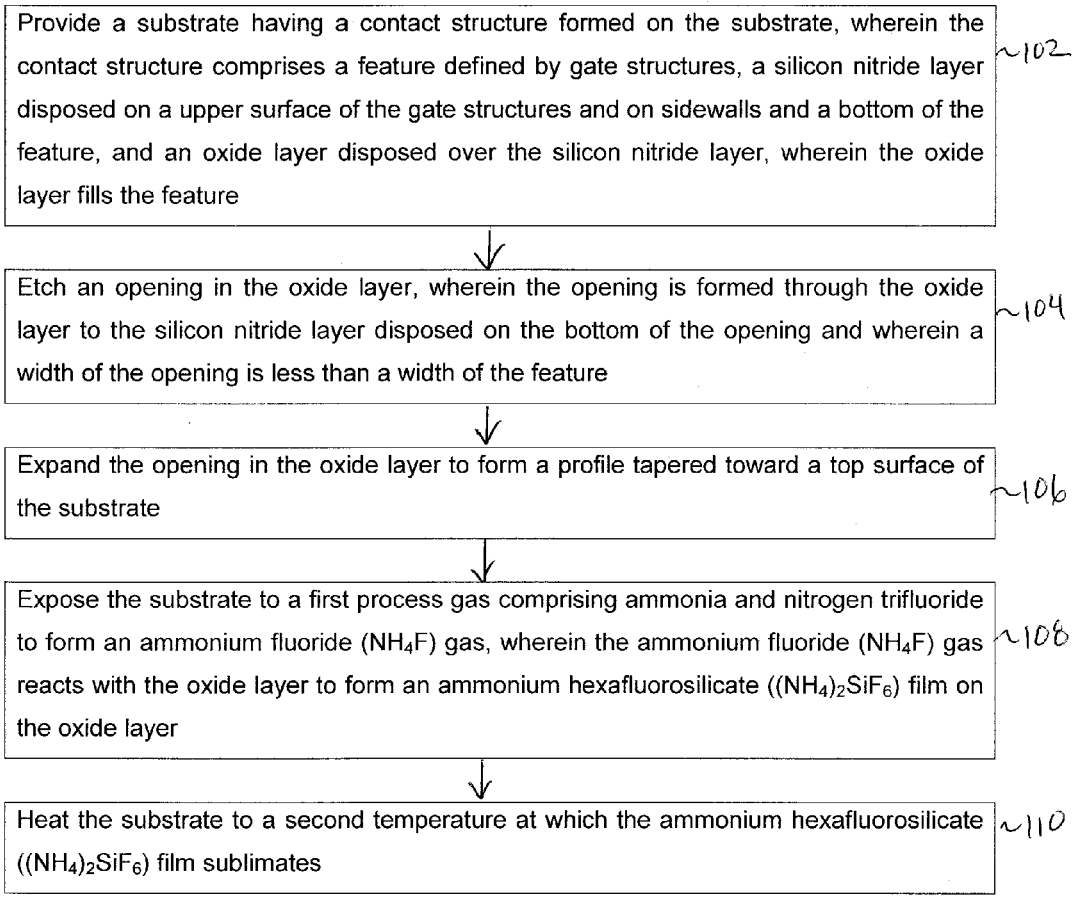
FIG. 1 is a flow diagram of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide methods for processing a substrate that may advantageously provide contact structures, for example self-aligned contact structures. Embodiments of the present disclosure provide a selective lateral etching of a field oxide layer in a contact structure being fabricated that advantageously prevents or minimizes undesired thinning of a nitride layer formed over gate structures of the contact, thus advantageously minimizing the risk of electrical shortage and/or performance degradation in the completed device due to nitride layer thinning.

FIG. 1 is a flow diagram of a method 100 for processing a substrate in accordance with some embodiments of the present disclosure. The method of FIG. 1 is described with reference to FIGS. 2A-2F where appropriate.

Figure 2A:
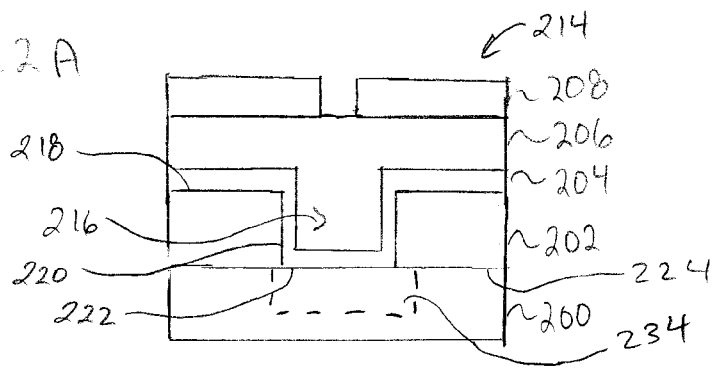
FIGS. 2A-2F respectively depict the stages of fabrication of forming a shallow trench isolation structure in a silicon germanium layer accordance with some embodiments of the present disclosure.

The method 100 generally begins at 102, as depicted in FIG. 2A, by providing a substrate 200 having a contact structure 214 formed on the substrate 200. In some embodiments, the contact structure 234 is formed over a metal contact 234, which is any suitable conductive material. In some embodiments, the substrate 200 may be, for example, silicon, silicon oxide, silicon nitride, or the like. In some embodiments, the contact structure 214 is a self-aligned contact structure. The contact structure 214 further comprises a feature 216 defined by gate structures 202. In some embodiments, the gate structures 202 are formed by depositing layers of a gate oxide, a polysilicon layer above the gate oxide and an oxide hard mask above the polysilicon layer, followed by photolithographically forming these layers into gate structures 202 having the feature 216 formed between the gate structures 202. In some embodiments, the distance between the gate structures 202 (e.g., the width of the feature 216) is about 300 angstroms to about 800 angstroms.

The contact structure 214 further comprises a silicon nitride layer 204 deposited on an upper surface 218 of the gate structures 202 and on sidewalls 220 and a bottom 22 of the feature 216. In some embodiments, the silicon nitride layer 204 may be deposited using any suitable conformal deposition process, such as a chemical vapor deposition process, an atomic layer deposition process, or the like. The silicon nitride layer 204 acts as an electrical insulator. The silicon nitride layer 204 may have any thickness suitable for acting as an electrical insulator, for example a thickness of about 10 angstroms to about 50 angstroms, such as 10 angstroms. An oxide layer 206 is deposited over the silicon nitride layer 204, such that the oxide layer 206 fills the feature 216. In some embodiments, the oxide layer is silicon oxide ($SiO_x$), for example silicon dioxide ($SiO_2$). The oxide layer 206 may have any suitable thickness, for example, about 1000 angstroms to about 5000 angstroms. The oxide layer 206 may similarly be deposited using any suitable deposition process, for example a chemical vapor deposition process, an atomic layer deposition process, or the like. A patterned mask layer 208 is deposited over the oxide layer 206 to subsequently etch an opening 210 into the oxide layer 206 as described below. The patterned mask layer 208 may be any suitable mask layer such as a hard mask or photoresist layer. The patterned mask layer 208 may be formed by any process suitable to form a patterned mask layer 208 capable of providing an adequate template for defining a pattern in the underlying oxide layer 206. For example, in some embodiments, the patterned mask layer 208 may be formed via a patterned etch process.

Figure 2B:
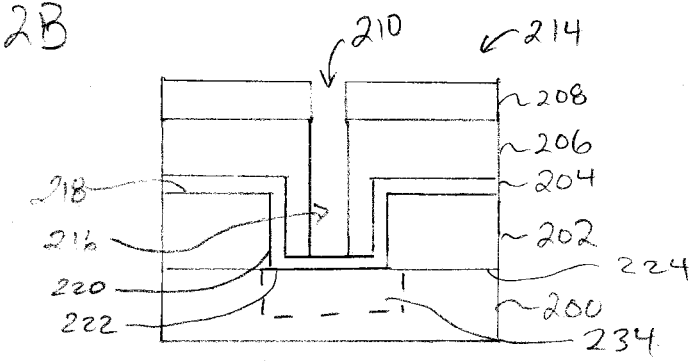

At 104, and as depicted in FIG. 2B, an opening 210 is etched into the oxide layer 206. The opening 210 is formed through the oxide layer 206 to the silicon nitride layer 204 disposed on the bottom 222 of the opening 210. The opening 210 has a width that is less than the width between the silicon nitride layer 204 deposited on the sidewalls 220 of the feature 216. For example, in some embodiments, the silicon nitride layer 204 deposited on the sidewalls 220 of the feature 216 is at least partially covered, or in some embodiments completely covered, by the remaining oxide layer 206. Since the silicon nitride layer 204 on the sidewalls 220 remain covered by the oxide layer 206, the silicon nitride layer 204 is advantageously not exposed to the etch process at 104, which minimizes or prevents damage to the silicon nitride layer 204 that might otherwise occur during convention etch processes to etch an opening into a contact structure.

The opening 210 may be etched via any etching process suitable for etching an oxide material to form an opening 210 having vertical or substantially vertical sidewalls. For example, the substrate may be exposed to an etching plasma formed using a halogen containing gas, for example a fluorine-containing gas. In some embodiments, the fluorine containing gas includes a fluorocarbon ($C_xF_y$) or a hydrofluorcarbon ($C_xH_yF_z$), for example tetrafluoromethane ($CF_4$), hexafluoroethane ($C_2F_6$), fluoromethane ($CH_3F$), difluoromethane ($CH_2F_2$), methyl trifluoride ($CHF_3$), hexafluorobutadiene ($C_4F_6$), and octafluorocyclobutane ($C_4F_8$) or the like. The width of the opening 210 is less than the width of the feature 216. In some embodiments, the opening 210 has a width of about 100 to about 200 angstroms. As depicted in FIG. 2B, following the formation of the opening 210, the oxide layer 206 remains on the silicon nitride layer 204 disposed on the sidewalls 220 of the feature 216.

Figure 2C:
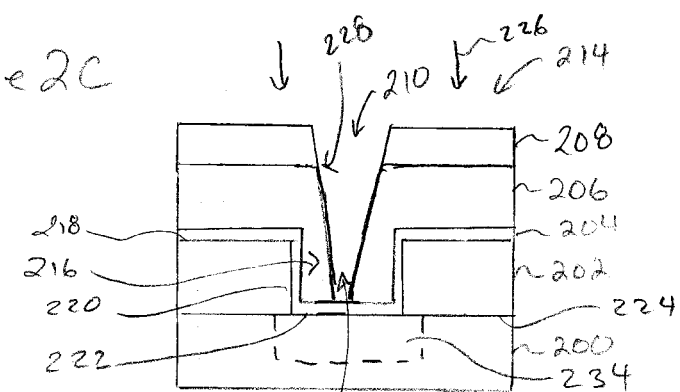

Once the initial opening 210 is formed, the oxide layer 206 may be laterally etched to remove the remaining oxide layer 206 within the feature 216. For example, at 106, and as depicted in FIG. 2C, the opening 210 is expanded to form a profile tapered toward a top surface 224 of the substrate 200. The opening 210 is tapered such that a top portion 228 of the opening 210 is wider than a bottom portion 232 of the opening 210 (e.g., near the bottom 222 of the feature 216). In some embodiments, the ratio of the diameter of the top portion 228 of the opening 210 to the bottom portion of the opening 210 is about 5:1 to about 20:1, for example about 4:1.

The opening 210 is tapered by exposing the substrate 200 to a second process gas 226, while applying a bias power to the substrate 200. The bias power advantageously controls the profile of the opening 210 by removing a greater amount of oxide material from the top portion 228 of the opening 210, which has the most exposure to the etch process, as compared to the bottom portion 232 of the opening 210. In some embodiments, application of the bias is dependent upon the desired size of the top portion 228 of the opening. For example, in some embodiments, the bias power is applied at about 200 watts to about 1000 watts. For example, in some embodiments, a bias power of about 200 watts to about 1000 watts at a frequency of about 13 MHz is applied to the substrate 200 for about 20 seconds to about 60 seconds.

In some embodiments, the second process gas 226 is an inert gas such as argon or xenon. The inventors have observed that using a second process gas having heavier atoms, for example argon or xenon, is more effective in etching the top portion 228 of the opening 210 than a process gas having lighter atoms, such as helium. In some embodiments, the second process gas 226 may be provided to the process chamber at any suitable flow rate to etch the oxide layer 206. For example, in some embodiments, the second process gas 226 may be provided at a total flow rate of about 300 sccm to about 1000 sccm. As depicted in FIG. 2C, following the formation of the tapered profile of the opening 210, oxide layer 206 material remains on the silicon nitride layer 204 disposed on the sidewalls 220 of the feature 216.

Figure 2D:
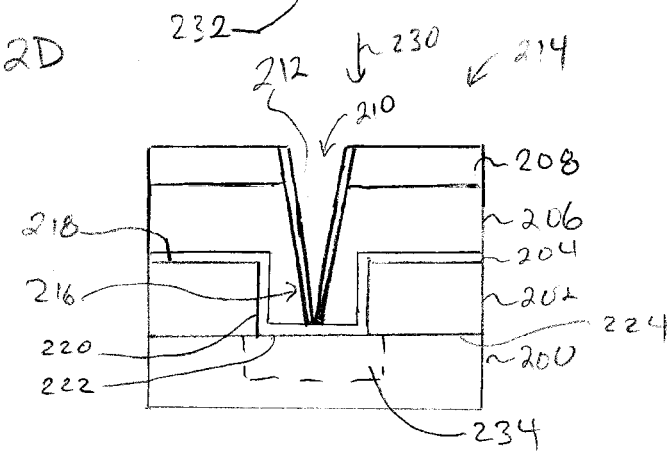

Next at 108, and as depicted in FIG. 2D, the substrate 200 is exposed to a first process gas 230 comprising ammonia ($NH_3$) and nitrogen trifluoride ($NF_3$), which react to form ammonium fluoride ($NH_4F$) gas. Not wishing to be bound by theory, it is believed that the ammonium fluoride ($NH_4F$) gas reacts with the oxide layer 206 to selectively etch the oxide layer 206 in a lateral direction toward the sidewalls 220 of the feature 216 and form ammonium hexafluorosilicate (($NH_4)_2SiF_6$), and water vapor ($H_2O$) by-products. The $H_2O$ vapors are evacuated from the processing chamber, leaving a thin film of ammonium hexafluorosilicate (($NH_4)_2SiF_6$) behind on the surface of the oxide layer 206. In some embodiments, the substrate 200 is maintained at a first temperature of less than about 50 degrees Celsius to promote formation of the ammonium hexafluorosilicate (($NH_4)_2SiF_6$) film 212 on the surface of the oxide layer 206.

In some embodiments, the first process gas 230 may be provided to the process chamber at any suitable flow rate to form the ammonium fluoride ($NH_4F$) gas. The amount of each gas introduced into the processing chamber is variable and may be adjusted to accommodate, for example, the thickness of the oxide layer to be removed. For example, in some embodiments, the first process gas 230 may be provided at a total flow rate of about 30 sccm to about 300 sccm. In some embodiments, the ratio of ammonia ($NH_3$) to nitrogen trifluoride ($NF_3$) in the first process gas 230 is about 1:1 to about 100:1, for example about 2:1. The combination of ammonia and nitrogen trifluoride advantageously removes the oxide layer 206 material with selectivity over the silicon nitride layer 204 material. Increasing the amount of nitrogen trifluoride in the first process gas can advantageously increase the etch rate of the oxide layer to be removed. In some embodiments, the first process gas 230 further comprises an inert gas, such as one of argon, helium, xenon, or the like, or a combination thereof. In some embodiments, the process gas comprises greater than about 90% inert gas with the balance being a mixture of ammonia and nitrogen trifluoride.

In some embodiments, the first process gas 230 is ignited in the process chamber, for example the process chamber 300 described below, to form a plasma. In some embodiments, the first process gas 230 may be ignited into a plasma by coupling radio frequency (RF) power at a suitable frequency to the first process gas 230 within a process chamber under suitable conditions to establish the plasma. In some embodiments, about 200 watts to about 1500 watts of RF power may be provided, for example, at a frequency of about 2 to about 161 MHz. The plasma energy dissociates the ammonia and nitrogen trifluoride gases into reactive species that combine to form a highly reactive ammonia fluoride ($NH_4F$) compound. Additional process parameters may be utilized to promote plasma ignition and stability. For example, in some embodiments, the process chamber may be maintained at a temperature of between about 30 to about 85 degrees Celsius during plasma ignition. Additionally, in some embodiments, the process chamber may be maintained at a pressure of between about 10 to about 1000 mTorr.

Figure 2E:
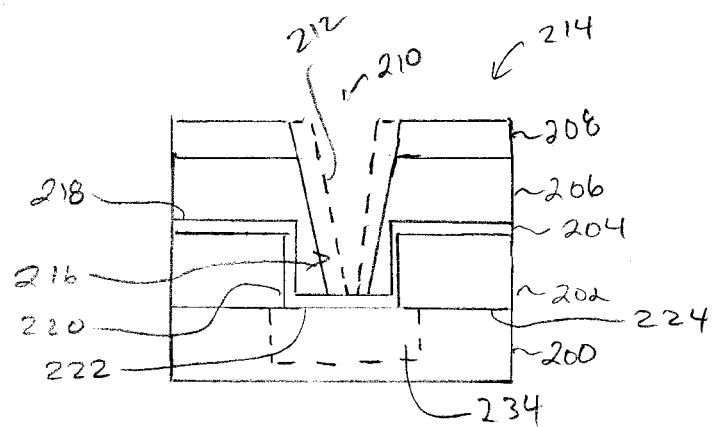
Figure 2F:
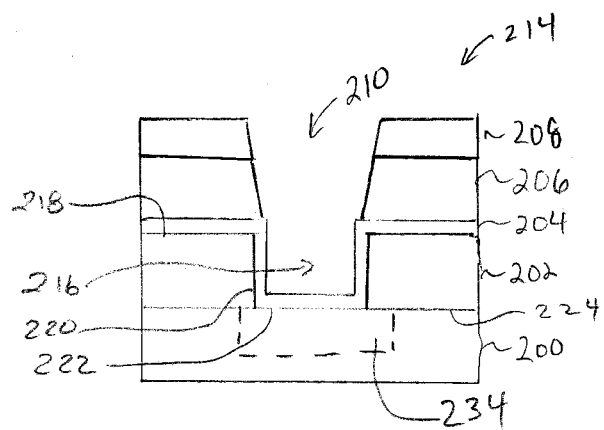

Next at 110, and as depicted in FIG. 2E, the substrate 200 is heated to a second temperature at which the ammonium hexafluorosilicate (($NH_4)_2SiF_6$) film 212 dissociates or sublimates to selectively etch the oxide layer 206 in a lateral direction toward the sidewalls 220 of the feature 216. The second temperature may be any temperature sufficient to dissociate or sublimate the ammonium hexafluorosilicate (($NH_4)_2SiF_6$) film 212 into volatile $SiF_4$, $NH_3$, and HF products. The second temperature may be constrained by hardware limitations, materials limitations, and/or application limitations (e.g., thermal budget or maximum temperature limits to prevent device or structure damage). In some embodiments, the substrate 200 is heated to a second temperature of about 100 to about 150 degrees Celsius, or in some embodiments greater than about 100 degrees Celsius, to vaporize the reacted ammonium hexafluorosilicate (($NH_4)_2SiF_6$) film 212.

In some embodiments, the selectivity of oxide layer 206 material to the silicon nitride layer 204 material is about 1:1 to about 10:1, or in some embodiments greater than about 10:1, for example about 10:1 to about 20:1.

Next, as depicted in FIG. 2F, 108-110 may be repeated until the oxide layer 206 is removed or substantially removed from the sidewalls 220 and bottom 222 of the feature 216. The oxide layer 206 remains above the upper surface 218 of the gate structures 202. In some embodiments, 108-110 may be repeated for 3 to 5 cycles. In some embodiments, each cycle is performed for about 60 seconds to about 360 seconds.

Once the oxide layer 206 is removed or substantially removed from the sidewalls 220 and bottom 222 of the feature 216 the method 100 generally ends and the substrate 200 may continue to be processed as desired. For example, in some embodiments, the patterned mask layer 208 may be removed, the substrate may subsequently undergo a cleaning process, or additional fabrication processes, such as filling the feature 216 with a conductive material, may be performed to complete the desired structures and devices on the substrate.

Figure 3:
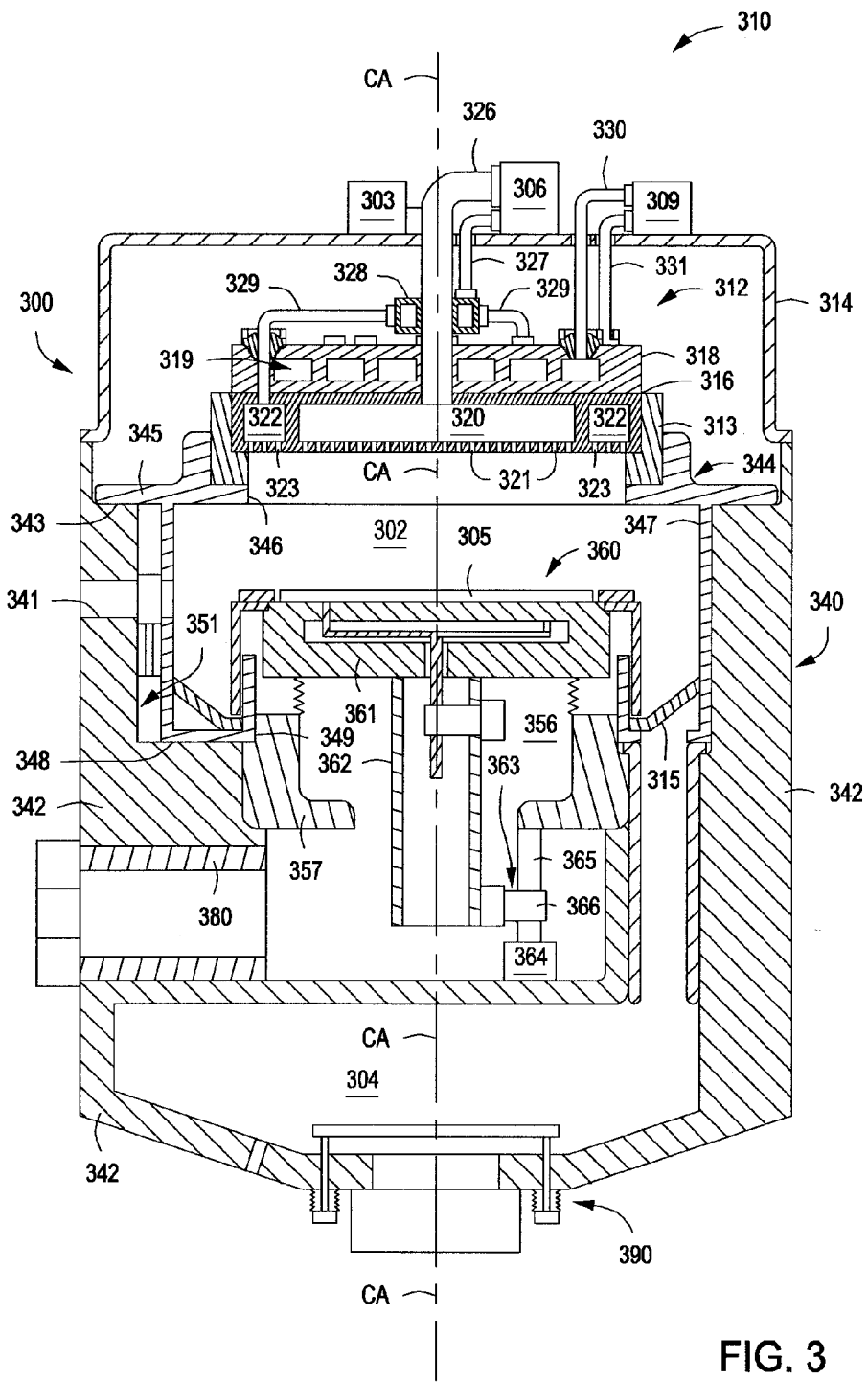
FIG. 3 depicts a schematic side view of a process chamber suitable for performing portions of the present disclosure.

FIG. 3 depicts a schematic diagram of an illustrative plasma process chamber 300 of the kind that may be used to practice embodiments of the disclosure as discussed herein. The plasma process chamber 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif.

The plasma processing chamber 300 may be a plasma etch chamber, a plasma enhanced chemical vapor deposition chamber, a physical vapor deposition chamber, a plasma treatment chamber, an ion implantation chamber, or other suitable vacuum processing chamber. The plasma processing chamber 300 generally includes a chamber lid assembly 310, a chamber body assembly 340, and an exhaust assembly 390, which collectively enclose a processing region 302 and an evacuation region 304. In practice, processing gases are introduced into the processing region 302 and ignited into a plasma using RF power. A substrate 305 is positioned on a substrate support assembly 360 and exposed to the plasma generated in the processing region 302 to perform a plasma process on the substrate 305, such as etching, chemical vapor deposition, physical vapor deposition, implantation, plasma annealing, plasma treating, abatement, or other plasma processes. Vacuum is maintained in the processing region 302 by the exhaust assembly 390, which removes spent processing gases and byproducts from the plasma process through the evacuation region 304.

The chamber lid assembly 310 generally includes an upper electrode 312 (or anode) isolated from and supported by the chamber body assembly 340 and a chamber lid 314 enclosing the upper electrode 312. The upper electrode 312 is coupled to an RF power source 303 via a conductive gas inlet tube 326. The conductive gas inlet tube 326 is coaxial with a central axis (CA) of the chamber body assembly 340 so that both RF power and processing gases are symmetrically provided. The upper electrode 312 includes a showerhead plate 316 attached to a heat transfer plate 318.

The showerhead plate 316 has a central manifold 320 and one or more outer manifolds 322. The one or more outer manifolds 322 circumscribe the central manifold 320. The central manifold 320 receives processing gases from a gas source 306 through the gas inlet tube 326 and distributes the received processing gases into a central portion of the processing region 302 through a plurality of gas passages 321. The outer manifold(s) 322 receives processing gases, which may be the same or a different mixture of gases received in the central manifold 320, from the gas source 306. The outer manifold(s) 322 then distributes the received processing gases into an outer portion of the processing region 302 through a plurality of gas passages 323. The manifolds 320, 322 have sufficient volume to function as a plenum so that uniform pressure is provided to each gas passage 321 associated with a respective manifold 320, 322.

A processing gas from the gas source 306 is delivered through an inlet tube 327 into a ring manifold 328 concentrically disposed around the gas inlet tube 326. From the ring manifold 328, the processing gas is delivered through a plurality of gas tubes 329 to the outer manifold(s) 322. In one embodiment, the ring manifold 328 includes a recursive gas path to assure that gas flows equally from the ring manifold 328 into the gas tubes 329.

A heat transfer fluid is delivered from a fluid source 309 to the heat transfer plate 318 through a fluid inlet tube 330. The fluid is circulated through one or more fluid channels 319 disposed in the heat transfer plate 318 and returned to the fluid source 309 via a fluid outlet tube 331.

The chamber body assembly 340 includes a chamber body 342. The substrate support assembly 360 is centrally disposed within the chamber body 342 and positioned to support the substrate 305 in the processing region 302 symmetrically about the central axis (CA).

An upper liner assembly 344 is disposed within an upper portion of the chamber body 342 circumscribing the processing region 302. The upper liner assembly 344 shields the upper portion of the chamber body 342 from the plasma in the processing region 302 and is removable to allow periodic cleaning and maintenance. In one embodiment, the upper liner assembly 344 is temperature controlled, such as by an AC heater (not shown) in order to enhance the thermal symmetry within the chamber and symmetry of the plasma provided in the processing region 302.

The chamber body 342 includes a ledge 343 that supports an outer flange 345 of the upper liner assembly 344. An inner flange 346 of the upper liner assembly 344 supports the upper electrode 312. An insulator 313 is positioned between the upper liner assembly 344 and the upper electrode 312 to provide electrical insulation between the chamber body assembly 340 and the upper electrode 312.

The upper liner assembly 344 includes an outer wall 347 attached to the inner and outer flanges (346,345), a bottom wall 348, and an inner wall 349. The outer wall 347 and inner wall 349 are substantially vertical, cylindrical walls. The outer wall 347 is positioned to shield chamber body 342 from plasma in the processing region 302, and the inner wall 349 is positioned to at least partially shield the side of the substrate support assembly 360 from plasma in the processing region 302. The bottom wall 348 joins the inner and outer walls (349, 347).

The processing region 302 is accessed through a slit valve tunnel 341 disposed in the chamber body 342 that allows entry and removal of the substrate 305 into/from the substrate support assembly 360. The upper liner assembly 344 has a slot 350 disposed therethrough that matches the slit valve tunnel 341 to allow passage of the substrate 305 therethrough.

The substrate support assembly 360 generally includes lower electrode 361 (or cathode) and a hollow pedestal 362, the center of which the central axis (CA) passes through, and is supported by a central support member 357 disposed in the central region 356 and supported by the chamber body 342. The central axis (CA) also passes through the center of the central support member 357. The lower electrode 361 is coupled to the RF power source 303 through a matching network (not shown) and a cable (not shown) routed through the hollow pedestal 362. When RF power is supplied to the upper electrode 312 and the lower electrode 361, an electrical field formed therebetween ignites the processing gases present in the processing region 302 into a plasma.

The central region 356 is sealed from the processing region 302 and may be maintained at atmospheric pressure, while the processing region 302 is maintained at vacuum conditions.

An actuation assembly 363 is positioned within the central region 356 and attached to the chamber body 342 and/or the central support member 357 to raises or lowers the pedestal 362. Since the lower electrode 361 is supported by the pedestal 362, the actuation assembly 363 provides vertical movement of the lower electrode 361 relative to the chamber body 342, the central support member 357, and the upper electrode 312. In addition, since the substrate 305 is supported by the lower electrode 361, the gap between the substrate 305 and the showerhead plate 316 may also be varied, resulting in greater control of the process gas distribution across the substrate 305.

In one embodiment, the lower electrode 361 is an electrostatic chuck, and thus includes one or more electrodes (not shown) disposed therein. A voltage source (not shown) biases the one or more electrodes with respect to the substrate 305 to create an attraction force to hold the substrate 305 in position during processing. Cabling coupling the one or more electrodes to the voltage source is routed through the hollow pedestal 362 and out of the chamber body 342 through one of the plurality of access tubes 380.

A conductive, slant mesh liner 315 is positioned in a lower portion of the upper liner assembly 344. The slant mesh liner 315 may have a plurality of apertures formed there through to allow exhaust gases to be drawn uniformly therethrough, which in turn, facilitates uniform plasma formation in the processing region 302 and allows greater control of the plasma density and gas flow in the processing region 302.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of processing a substrate, comprising:
   (a) providing a substrate having a contact structure formed on the substrate, wherein the contact structure comprises a feature defined by gate structures, a silicon nitride layer disposed on a upper surface of the gate structures and on sidewalls and a bottom of the feature, and an oxide layer disposed over the silicon nitride layer, wherein the oxide layer fills the feature;
   (b) etching an opening in the oxide layer, wherein the opening is formed through the oxide layer to the silicon nitride layer disposed on the bottom of the opening and wherein a width of the opening is less than a width of the feature;
   (c) expanding the opening in the oxide layer to form a profile tapered toward a top surface of the substrate;
   (d) exposing the substrate to a first process gas comprising ammonia and nitrogen trifluoride to form an ammonium fluoride ($NH_4F$) gas, wherein the ammonium fluoride ($NH_4F$) gas reacts with the oxide layer to form an ammonium hexafluorosilicate (($NH_4$)$_2SiF_6$) film on the oxide layer; and
   (e) heating the substrate to a second temperature to sublimate the ammonium hexafluorosilicate (($NH_4$)$_2SiF_6$) film.

2. The method of claim 1, further comprising etching the opening using a fluorine-containing process gas.

3. The method of claim 1, wherein expanding the opening further comprises exposing the substrate to a second process gas.

4. The method of claim 3, wherein expanding the opening further comprises applying a bias power to the substrate while exposing the substrate to the second process gas.

5. The method of claim 4, wherein the second process gas is argon.

6. The method of claim 4, wherein the bias power is applied at about 200 watts to about 1000 watts.

7. The method of claim 1, wherein the opening has a top portion and a bottom portion and wherein a ratio of a diameter of the top portion to the bottom portion is about 5:1 to about 20:1.

8. The method of claim 1, further comprising exposing the substrate to the first process gas at a temperature of less than about 50 degrees Celsius.

9. The method of claim 1, further comprising repeating (d)-(e) for 3-5 cycles, wherein each cycle is performed for about 20 seconds.

10. The method of claim 1, further comprising repeating (d)-(e) until the oxide layer is substantially etched from the sidewalls and bottom of the feature.

11. The method of claim 1, wherein a ratio of ammonia and nitrogen trifluoride is about 1:1 to about 100:1.

12. The method of claim 1, wherein the first process gas further comprises an inert gas.

13. The method of claim 12, wherein the first process gas comprises greater than about 90% inert gas.

14. The method of claim 1, wherein exposing the substrate to a first process gas further comprises providing radio frequency (RF) power to the first process gas to form a plasma.

15. The method of claim 1, wherein the second temperature is greater than about 100 degrees Celsius to vaporize the ammonium hexafluorosilicate $((NH_4)_2SiF_6)$ film.

16. A method of processing a substrate, comprising:
(a) providing a substrate having a contact structure formed on the substrate, wherein the contact structure comprises a feature defined by gate structures, a silicon nitride layer disposed on a upper surface of the gate structures and on sidewalls and a bottom of the feature, and an oxide layer disposed over the silicon nitride layer, wherein the oxide layer fills the feature;
(b) etching an opening in the oxide layer, wherein the opening is formed through the oxide layer to the silicon nitride layer disposed on the bottom of the opening and wherein a width of the opening is less than a width of the feature;
(c) expanding the opening in the oxide layer to form a profile tapered toward a top surface of the substrate by applying a bias power to the substrate while exposing the substrate to a second process gas;
(d) exposing the substrate to a first process gas comprising ammonia and nitrogen trifluoride to form an ammonium fluoride $(NH_4F)$ gas, wherein the ammonium fluoride $(NH_4F)$ gas reacts with the oxide layer to form an ammonium hexafluorosilicate $((NH_4)_2SiF_6)$ film on the oxide layer;
(e) heating the substrate to a second temperature to sublimate the ammonium hexafluorosilicate $((NH_4)_2SiF_6)$ film; and
(f) repeating (d)-(e) until the oxide layer is substantially etched from the sidewalls and bottom of the feature.

17. A computer readable medium, having instructions stored thereon which, when executed, cause a process chamber to perform a method of processing a substrate, the method comprising:
(a) providing a substrate having a contact structure formed on the substrate, wherein the contact structure comprises a feature defined by gate structures, a silicon nitride layer disposed on a upper surface of the gate structures and on sidewalls and a bottom of the feature, and an oxide layer disposed over the silicon nitride layer, wherein the oxide layer fills the feature;
(b) etching an opening in the oxide layer, wherein the opening is formed through the oxide layer to the silicon nitride layer disposed on the bottom of the opening and wherein a width of the opening is less than a width of the feature;
(c) expanding the opening in the oxide layer to form a profile tapered toward a top surface of the substrate;
(d) exposing the substrate to a first process gas comprising ammonia and nitrogen trifluoride to form an ammonium fluoride $(NH_4F)$ gas, wherein the ammonium fluoride $(NH_4F)$ gas reacts with the oxide layer to form an ammonium hexafluorosilicate $((NH_4)_2SiF_6)$ film on the oxide layer; and
(e) heating the substrate to a second temperature to sublimate the ammonium hexafluorosilicate $((NH_4)_2SiF_6)$ film.

18. The computer readable medium of claim 17, wherein expanding the opening further comprises applying a bias power to the substrate while exposing the substrate to a second process gas.

19. The computer readable medium of claim 18, wherein the second process gas is argon.

20. The computer readable medium of claim 18, wherein the bias power is applied at about 200 watts to about 1000 watts.

* * * * *